US 9,972,608 B2

(12) United States Patent
Wu et al.

(10) Patent No.: US 9,972,608 B2
(45) Date of Patent: May 15, 2018

(54) LIGHT EMITTING DIODE DEVICE

(71) Applicant: Everlight Electronics Co., Ltd., New Taipei (TW)

(72) Inventors: Wei-Ting Wu, New Taipei (TW); Jun Yu Chen, New Taipei (TW); Han-Hsiang Chiang, New Taipei (TW)

(73) Assignee: EVERLIGHT ELECTRONICS CO., LTD., New Taipei (TW)

(*) Notice: Subject to any disclaimer, the term of this patent is extended or adjusted under 35 U.S.C. 154(b) by 0 days. days.

(21) Appl. No.: 15/369,492

(22) Filed: Dec. 5, 2016

(65) Prior Publication Data
US 2017/0084588 A1 Mar. 23, 2017

Related U.S. Application Data

(62) Division of application No. 14/788,696, filed on Jun. 30, 2015.

(51) Int. Cl.
*H01L 25/075* (2006.01)
*H01L 33/38* (2010.01)
(Continued)

(52) U.S. Cl.
CPC ...... *H01L 25/0753* (2013.01); *H01L 23/5384* (2013.01); *H01L 33/0079* (2013.01); *H01L 33/08* (2013.01); *H01L 33/20* (2013.01); *H01L 33/38* (2013.01); *H01L 33/486* (2013.01); *H01L 33/62* (2013.01); *H01L 2224/48137* (2013.01);
(Continued)

(58) Field of Classification Search
CPC ............................ H01L 33/38; H01L 25/0753
See application file for complete search history.

(56) References Cited

U.S. PATENT DOCUMENTS 7,906,788 B2 * 3/2011 Nagai ................. H01L 25/0753
257/88
8,648,373 B2 * 2/2014 Toyama .............. H01L 25/0753
257/98
(Continued)

FOREIGN PATENT DOCUMENTS

CN 101994913 A 3/2011
DE 102008021402 A1 11/2009
(Continued)

OTHER PUBLICATIONS

Taiwanese Office Action, dated Feb. 23, 2017, in a counterpart Taiwanese patent application, No. TW 105117415.
(Continued)

*Primary Examiner* — Asok K Sarkar
*Assistant Examiner* — Grant Withers
(74) *Attorney, Agent, or Firm* — Chen Yoshimura LLP

(57) ABSTRACT

A light emitting diode device is provided. The light emitting diode device has a substrate, a plurality of metal pads, a plurality of LEDs and a first metal conductive wire. A plurality of first metal pads of the metal pads are disposed on a first surface of the substrate, and the LEDs are disposed on a part of the first metal pads. Each of the LEDs has at least one first electrode contact. The first electrode contact of each of the LEDs electrically connected to the first metal conductive wire has the same electrode contact polarity. Moreover, another light emitting diode device is also provided.

18 Claims, 7 Drawing Sheets

(51) Int. Cl.
*H01L 33/08* (2010.01)
*H01L 33/20* (2010.01)
*H01L 33/62* (2010.01)
*H01L 33/00* (2010.01)
*H01L 33/48* (2010.01)
*H01L 23/538* (2006.01)

(52) U.S. Cl.
CPC ............ *H01L 2224/48247* (2013.01); *H01L 2224/48257* (2013.01); *H01L 2224/49113* (2013.01); *H01L 2224/73204* (2013.01)

(56) References Cited

U.S. PATENT DOCUMENTS

| | | | |
|---|---|---|---|
| 2004/0070333 A1 | 4/2004 | Lin et al. | |
| 2007/0029569 A1 | 2/2007 | Andrews | |
| 2010/0051972 A1* | 3/2010 | Chen | H01L 25/0753 257/88 |
| 2010/0277919 A1 | 11/2010 | Okada et al. | |
| 2012/0104426 A1 | 5/2012 | Chan et al. | |

FOREIGN PATENT DOCUMENTS

| | | |
|---|---|---|
| EP | 1732132 A1 | 12/2006 |
| JP | 2006013324 A | 1/2006 |
| JP | 2006156603 A | 6/2006 |
| JP | 2007042781 A | 2/2007 |
| JP | 2007318133 A | 12/2007 |
| JP | 2009147082 A | 7/2009 |
| JP | 2010508621 A | 3/2010 |
| JP | 2012178400 A | 9/2012 |
| JP | 2012212865 A | 11/2012 |
| JP | 2014111708 A | 6/2014 |
| TW | I226713 B | 1/2005 |
| TW | 201125159 A | 7/2011 |
| WO | WO2014079939 A2 | 5/2014 |

OTHER PUBLICATIONS

Chinese Office Action, dated Jun. 2, 2017, in a counterpart Chinese patent application, No. CN 201510372591.X.

* cited by examiner

LIGHT EMITTING DIODE DEVICE

CROSS-REFERENCE TO RELATED APPLICATIONS

The present disclosure is part of a divisional application of U.S. patent application Ser. No. 14/788,696, which was filed on Jun. 30, 2015 claiming the priority benefit of Taiwan Patent Application No. 103122457, filed on Jun. 30, 2014, and Taiwan Patent Application No. 104120978, filed on Jun. 29, 2015. The aforementioned applications are incorporated herein by reference in their entirety.

TECHNICAL FIELD

The present disclosure relates to an optoelectronic device, and more particularly, to a light emitting diode (LED) device.

BACKGROUND

Unless otherwise indicated herein, approaches described in this section are not prior art to the claims listed below and are not admitted to be prior art by inclusion in this section.

As the LED technology becomes mature, the yields for LED manufacturing has been significantly improved, and the cost decreases accordingly. This makes the products adopting LEDs (e.g., LED flashlights, or LED lamps mounted on vehicles/motorcycles) become much popular in people's daily life.

Among these physical products adopting LEDs, the information signage boards present significant differences. In early days, the appliance of these information signage boards is limited by various factors such as the process yield, the unit cost, and the light emitting efficiency, such that they can only display a single line of information with a single color, besides, sizes of these LEDs adopted are also quite large. A new generation of information signage boards adopting the LEDs is capable of displaying multiple lines of information with various colors and size of the LEDs adopted are tiny.

For the aforesaid new generation of information signage boards adopting the LEDs, a surface thereof for displaying information is provided with a plurality of LED devices 10 arranged in an array. In detail, referring to FIG. 1, each of the LED devices 10 is composed of a substrate 20 and three LED chips 30.

As shown in FIG. 1, an upper surface of the substrate 20 is provided with a first wire-bonding region 21, a second wire-bonding region 22, a third wire-bonding region 23 and a die-bonding region 24, and the three LED chips 30 are a blue chip 31, a green chip 32 and a red chip 33, respectively. The die-bonding region 24 is disposed at the center of the substrate 20, the first wire-bonding region 21 is disposed at one side of the die-bonding region 24, and both the second wire-bonding region 22 and the third wire-bonding region 23 are disposed at the other side of the die-bonding region 24 that is opposite to the first wire-bonding region 21. It shall be noted that, in the circuit design of this LED device 10, blocks such as the first wire-bonding region 21, the second wire-bonding region 22, the third wire-bonding region 23 and the die-bonding region 24 are spaced apart from one another at a specific distance to avoid electrical conductivity therebetween.

Thus, in terms of the configuration of the upper surface of the substrate 20, the blue chip 31, the green chip 32 and the red chip 33 included in the three LED chips 30 are sequentially disposed on the upper portion, the lower portion and the central portion of the die-bonding region 24, the blue chip 31 on the upper portion can be electrically connected to the first wire-bonding region 21 and the second wire-bonding region 22 respectively via two first metal conductive wires 41, the green chip 32 on the lower portion can be electrically connected to the first wire-bonding region 21 and the third wire-bonding region 23 respectively via two second metal conductive wires 42, and the red chip 33 on the central portion can be electrically connected to the first wire-bonding region 21 via a single third metal conductive wire 43 since the adopted blue chip 31 and the green chip 32 are horizontal LED chips while the adopted red chip 33 is a vertical LED chip. Thereby, operations of the blue chip 31, the green chip 32 and the red chip 33 can be controlled according to signals inputted from an external controller.

However, in the aforesaid circuit design in which the upper surface of the substrate 20 is provided with three wire-bonding regions (i.e., the first wire-bonding region 21, the second wire-bonding region 22, and the third wire-bonding region 23) and one die-bonding region (i.e., the die-bonding region 24), limitations are made to the minimum area of each of the wire-bonding regions and the die-bonding region and specific distances need to be kept between each blocks to avoid electrical conductivity therebetween. Therefore, the size of the substrate 20 is restricted to not be smaller than a specific size. In other words, such information signage boards adopting the LEDs cannot meet the requirements of improving the resolution or to decreasing the size of the finished product due to the size limitation.

Accordingly, a long-felt need in the art is to provide an LED device, of which the substrate is with circuit design that requires a smaller substrate area so as to improve the resolution as well as to decrease the size of the product.

SUMMARY

The following summary is for illustrative purpose only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

The present disclosure provides a plurality of LED devices with small sizes.

An LED device according to the present disclosure comprises a substrate, a plurality of metal pads, a plurality of LED chips and a first metal conductive wire. The substrate has a first surface, a second surface disposed opposite to the first surface and a plurality of vias disposed between the first surface and the second surface. The plurality of metal pads include a plurality of first metal pads disposed on the first surface and a plurality of second metal pads disposed on the second surface respectively. The first metal pads disposed on the first surface are electrically connected with the second metal pads disposed on the second surface through the vias. Each of the plurality of LED chips has at least one first electrode contact and at least one second electrode contact, and the LED chips are disposed on a part of the first metal pads that are disposed on the first surface of the substrate. The first metal conductive wire is adapted to be electrically connected to the at least one first electrode contact of each of the LED chips. An end of the first metal conductive wire is electrically connected to one of the first metal pads which is disposed on the first surface of the substrate without the LED chips disposed thereon. At least one first electrode contact of each of the LED chips electrically connected to the first metal conductive wire has the same electrode contact polarity.

Another LED device according to the present disclosure comprises a substrate, a plurality of metal pads and a plurality of LED chips. The substrate has a first surface, a second surface disposed opposite to the first surface and a plurality of vias disposed between the first surface and the second surface. The plurality of metal pads comprise a plurality of first metal pads disposed on the first surface and a plurality of second metal pads disposed on the second surface respectively. The first metal pads disposed on the first surface are electrically connected with the second metal pads disposed on the second surface through the vias. Each of the LED chips has at least one first electrode contact and at least one second electrode contact. The LED chips are disposed on a part of the first metal pads. The second electrode contacts of the LED chips are electrically connected to the part of the first metal pads respectively. The first electrode contacts of the LED chips are electrically connected to another of the first metal pads. At least one of the LED chips is a flip chip. The flip chip extends across a gap between the first metal pad on which the flip chip is disposed and the another first metal pad so that the first electrode contact of the flip chip is electrically connected to the another first metal pad.

In an embodiment of the present disclosure, the substrate may be a rectangular substrate, the first metal pads may be four first metal pads, and the four first metal pads are arranged at four corners of the rectangular substrate respectively.

In an embodiment of the present disclosure, at least one of the LED chips is a vertical chip.

In an embodiment of the present disclosure, the LED chips include a blue chip, a green chip and a red chip.

In an embodiment of the present disclosure, the blue chip has a first electrode contact and a second electrode contact, the first electrode contact and the second electrode contact are coplanar with each other, the first metal pad that has the blue chip disposed thereon has a first wire-bonding region, and a second metal conductive wire is adapted to electrically connect the second electrode contact of the blue chip and the first wire-bonding region of the first metal pad.

In an embodiment of the present disclosure, the green chip has a first electrode contact and a second electrode contact, the first electrode contact and the second electrode contact are coplanar with each other, the first metal pad having the green chip disposed thereon has a second wire-bonding region, and a third metal conductive wire is adapted to electrically connect the second electrode contact of the green chip and the second wire-bonding region of the first metal pad.

In an embodiment of the present disclosure, each of the blue chip and the green chip has a first electrode contact and a second electrode contact, each of the first electrode contacts is coplanar with the corresponding second electrode contact, the first metal pad having the blue chip disposed thereon has a first wire-bonding region, the first metal pad having the green chip disposed thereon has a second wire-bonding region, a second metal conductive wire is adapted to electrically connect the second electrode contact of the blue chip and the first wire-bonding region of the first metal pad having the blue chip disposed thereon, and a third metal conductive wire is adapted to electrically connect the second electrode contact of the green chip and the second wire-bonding region of the first metal pad having the green chip disposed thereon.

In an embodiment of the present disclosure, the rectangular substrate has an area A, and the area A satisfies the following relational expression: $A \leq 0.8$ mm$\times 0.8$ mm.

In an embodiment of the present disclosure, the rectangular substrate has an area A, and the area A satisfies the following relational expression: $0.3$ mm$\times 0.3$ mm$\leq A \leq 0.8$ mm$\times 0.8$ mm.

In an embodiment of the present disclosure, the rectangular substrate has an area A, and the area A satisfies the following relational expression: $0.3$ mm$\times 0.3$ mm$\leq A \leq 0.6$ mm$\times 0.6$ mm.

In an embodiment of the present disclosure, the plurality of LED chips are electrically connected to the outside through the second metal pads disposed on the second surface of the substrate, and the magnitudes of currents of the LED chips are capable of being independently controlled.

In an embodiment of the present disclosure, the first metal pads are five first metal pads, four of the five first metal pads are disposed at four corners of the substrate respectively and the remaining one of the five first metal pads is not provided with any LED chip thereon, the LED chips are two first-color chips, one second-color chip and one third-color chip, the two first-color chips, the second-color chip and the third-color chip are disposed on the four first metal pads respectively, a first imaginary straight line connects centers of the two first-color chips having the same color, a second imaginary straight line connects the center of the second-color chip and the center of the third-color chip having different colors, and the first imaginary straight line is interlaced with the second imaginary straight line.

In an embodiment of the present disclosure, the substrate is a rectangular substrate, the four first metal pads are disposed at four corners of the rectangular substrate respectively, and the another first metal pad is disposed in the middle of the four first metal pads.

In an embodiment of the present disclosure, the two first-color chips are two red chips, the second-color chip is one green chip, and the third-color chip is one blue chip.

In an embodiment of the present disclosure, the LED chips are all vertical chips, each of the vertical chips has a first electrode contact, a first semiconductor layer, a light emitting layer, a second semiconductor layer, and a second electrode contact electrically connected to a corresponding one of the first metal pads. The first electrode contact, the first semiconductor layer, the light emitting layer, the second semiconductor layer, the second electrode contact and the corresponding first metal pad are arranged sequentially along a straight line.

In an embodiment of the present disclosure, the first metal pads include five first metal pads, four of the five first metal pads are the part of the first metal pads and are arranged at four corners of the substrate respectively, the remaining one of the five metal pads is the another first metal pad. The LED chips include two first-color chips, one second-color chip and one third-color chip. The two first-color chips, the second-color chip and the third-color chip are disposed on the four first metal pads respectively. A first imaginary straight line connects centers of the two first-color chips having the same color. A second imaginary straight line connects the center of the second-color chip and the center of the third-color chip having different colors. The first imaginary straight line is interlaced with the second imaginary straight line.

In an embodiment of the present disclosure, the substrate is a rectangular substrate. The four first metal pads are disposed at four corners of the rectangular substrate respectively, and the another first metal pad is disposed in the middle of the four first metal pads.

In an embodiment of the present disclosure, the two first-color chips are red chips, the second-color chip is a green chip, the third-color chip is a blue chip, the red chips are vertical chips, and the green chip and the blue chip are flip chips.

In an embodiment of the present disclosure, the first-color chips, the second-color chip and the third-color chip are all flip chips.

In an embodiment of the present disclosure, the LED device further comprises an anisotropic conductive adhesive. A first electrode contact of the flip chip is electrically connected to the another first metal pad through the anisotropic conductive adhesive, and a second electrode contact of the flip chip is electrically connected to a corresponding one of the first metal pads through the anisotropic conductive adhesive.

According to what described above, the LED device of an embodiment of the present disclosure electrically connects the same first metal conductive wire with the first electrode contacts of the plurality of LEDs so as to reduce the size of the LED device.

Moreover, the LED device of another embodiment of the present disclosure comprises at least one flip-chip LED chip, the flip-chip LED chip extends across a gap between two adjacent first metal pads, and the first electrode contact and the second electrode contact of the flip-chip LED chip are electrically connected to the two adjacent first metal pads respectively. Thereby, at least one flip-chip LED chip does not need an additional wire to be electrically connected to the corresponding first metal pad, which further reduces the size of the LED device.

The detailed technology and preferred embodiments implemented for the present disclosure are described in the following paragraphs accompanying the appended drawings for people skilled in this field to well appreciate the features of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Figure 1:
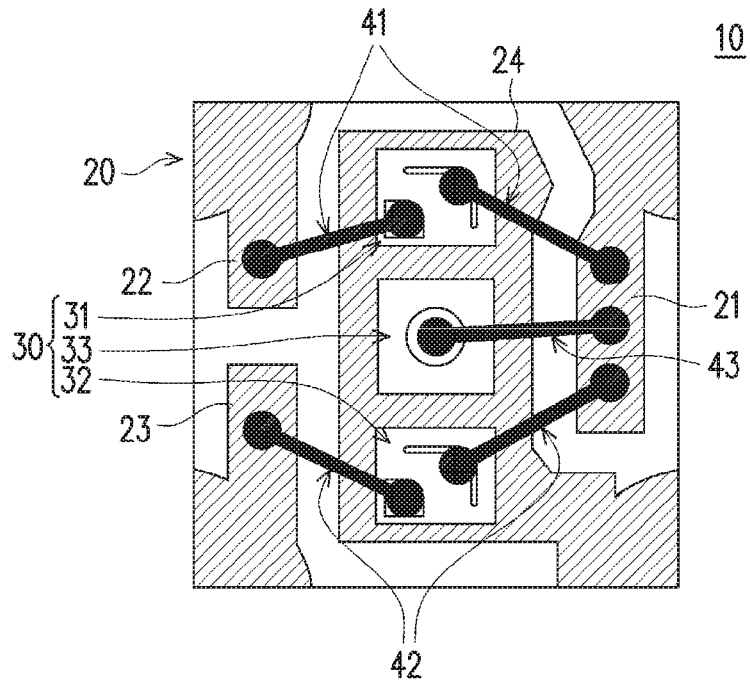
FIG. 1 is a schematic top view of an LED device in the prior art.
Figure 2:
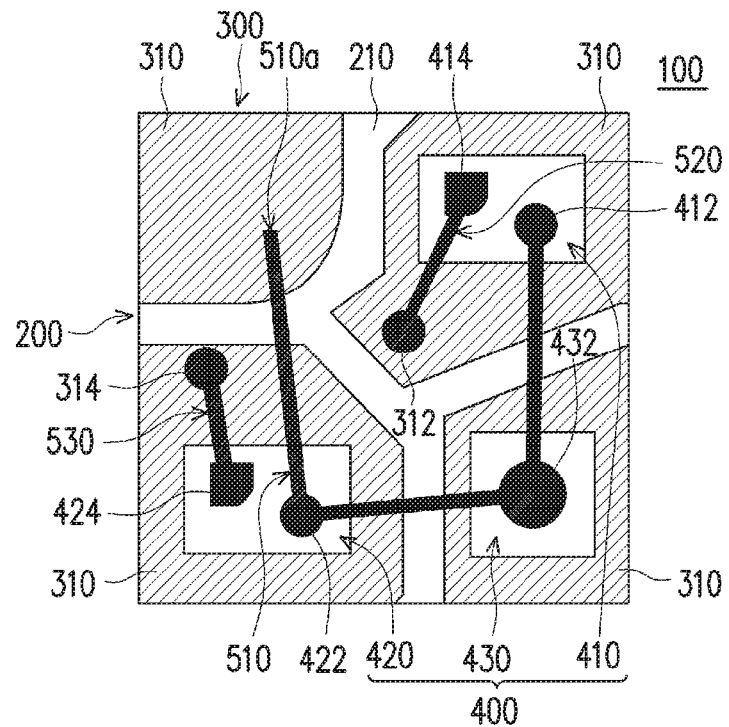
FIG. 2 is a schematic top view of an LED device according to an embodiment of the present disclosure.

As shown in FIG. 2, an LED device 100 according to an embodiment of the present disclosure can be used in an information board and may comprise elements such as a substrate 200, a plurality of metal pads 300, a plurality of LED chips 400 and a first metal conductive wire 510.

Figure 3:
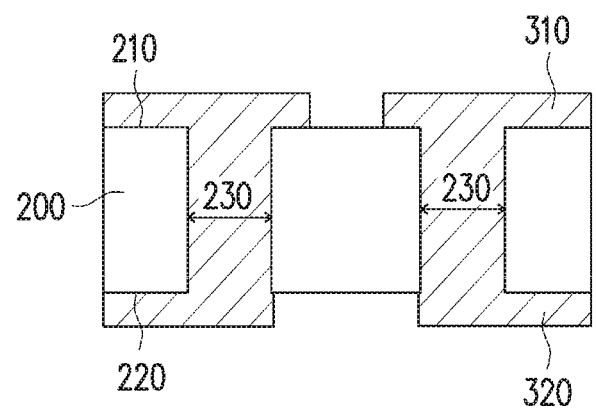
FIG. 3 is a schematic side view of the LED device according to the embodiment of the present disclosure.

Referring to FIG. 2 and FIG. 3 together, the substrate 200 has a first surface 210, a second surface 220 disposed opposite to the first surface 210 and a plurality of vias 230 disposed between the first surface 210 and the second surface 220. The plurality of metal pads 300 include a plurality of first metal pads 310 disposed on the first surface 210 and a plurality of second metal pads 320 disposed on the second surface 220 respectively, and the first metal pads 310 disposed on the first surface 210 are adapted to be electrically connected with the second metal pads 320 disposed on the second surface 220 through the vias 230.

Each of the LED chips 400 has at least one first electrode contact and at least one second electrode contact, and the LED chips 400 are disposed on a part of the first metal pads 310 that are disposed on the first surface 210. In the embodiment of FIG. 2 and FIG. 3, at least one of the LED chips 400 is a vertical LED chip, and the remaining LED chips 400 are horizontal LED chips, but the present disclosure is not limited thereto.

The first metal conductive wire 510 is adapted to be electrically connected to the at least one first electrode contact of each of the LED chips 400 so that an end of the first metal conductive wire 510 is electrically connected to one of the first metal pads 310 which is disposed on the first surface 210 of the substrate 200 but has none of the LED chips 400 disposed thereon. In other words, the first metal conductive wire 510 may be electrically connected to an area of the first surface 210 that has the first metal pads 310 disposed thereon, and the at least one first electrode contact of each of the LED chips 400 that is electrically connected with the first metal conductive wire 510 has the same electrode contact polarity.

It shall be additionally appreciated that, the LED chips 400 according to the embodiment of the present disclosure may be electrically connected to the outside environment or a controller through the second metal pads 320 disposed on the second surface 220 of the substrate 200, and the magnitudes of currents of the LED chips 400 are capable of being independently controlled to satisfy different display requirements.

In detail, in a preferred embodiment of the present disclosure, the substrate 200 of the LED device 100 is a rectangular substrate, the first metal pads 310 are four first metal pads 310, and the four first metal pads 310 are arranged at four corners of the substrate 200 respectively. Moreover, the LED chips 400 include a blue chip 410, a green chip 420 and a red chip 430, the blue chip 410 and the green chip 420 are horizontal LED chips, and the red chip 430 is a vertical LED chip.

Further speaking, in this embodiment, the blue chip 410 of the LED device 100 has a first electrode contact 412 and a second electrode contact 414, and the green chip 420 correspondingly has a first electrode contact 422 and a second electrode contact 424. In this embodiment, both the blue chip 410 and the green chip 420 are horizontal LED chips, the first electrode contact 412 and the second electrode contact 414 of the blue chip 410 are substantially coplanar with each other, and the first electrode contact 422 and the second electrode contact 424 of the green chip 420 are also substantially coplanar with each other.

On the other hand, the red chip 430 is a vertical LED chip, and when the red chip 430 is disposed on the first metal pad 310 that is disposed on the first surface 210 of the substrate 200 (as shown in FIG. 2), only a first electrode contact 432 will be seen.

The two first metal pads 310 respectively having the blue chip 410 and the green chip 420 disposed thereon have a first wire-bonding region 312 and a second wire-bonding region 314 respectively. That is, the first wire-bonding region 312 correspondingly belongs to the first metal pad 310 having the blue chip 410 disposed thereon, and the second wire-bonding region 314 correspondingly belongs to the first metal pad 310 having the green chip 420 disposed thereon.

Thus, through the aforesaid arrangement, a second metal conductive wire 520 may be used to electrically connect the second electrode contact 414 of the blue chip 410 and the first wire-bonding region 312 of the first metal pad 310 that has the blue chip 410 disposed thereon, and a third metal conductive wire 530 may be used to electrically connect the second electrode contact 424 of the green chip 420 and the second wire-bonding region 314 of the first metal pad 310 that has the green chip 420 disposed thereon.

According to the above descriptions, in the aforesaid preferred embodiment of the LED device 100 of the present disclosure as shown in FIG. 2, by defining the substrate 200 as a rectangular substrate and the LED chips 400 as three LED chips 400 (namely, a blue chip 410, a green chip 420 and a red chip 430), a single first metal conductive wire 510 can be electrically connected to the first electrode contact 412 of the blue chip 410, the first electrode contact 432 of the red chip 430 and the first electrode contact 422 of the green chip 420 sequentially in the order of from the upper right corner to the lower right corner and then to the lower left corner after the four first metal pads 310 are respectively arranged at four corners of the substrate 200, and the blue chip 410 and the green chip 420 are respectively disposed on two first metal pads 310 at the upper right corner and the lower left corner and the red chip 430 is disposed on the first metal pad 310 at the lower right corner. In this way, an end of the first metal conductive wire 510 finally ends up on the first metal pad 310 at the upper left corner, and the first electrode contact 412 of the blue chip 410, the first electrode contact 432 of the red chip 430 and the first electrode contact 422 of the green chip 420 have the same electrode contact polarity (i.e., are all positive electrodes or negative electrodes).

Meanwhile, the first metal pads 310 disposed on the first surface 210 may be electrically connected with the second metal pads 320 disposed on the second surface 220 through the vias 230. Therefore, when the blue chip 410 is a horizontal LED chip, the first metal pad 310 having the blue chip 410 disposed thereon is provided with the first wire-bonding region 312, and the second electrode contact 414 of the blue chip 410 is electrically connected with the first wire-bonding region 312 through the second metal conductive wire 520, so the second electrode contact 414 is electrically connected to one second metal pad 320 on the second surface 220, thereby connecting the first electrode contact 412 of the blue chip 410 to the second electrode contact 414 thereof. Similarly, when the green chip 420 is a horizontal LED chip, the first metal pad 310 having the green chip 420 disposed thereon is provided with the second wire-bonding region 314, and the second electrode contact 424 of the green chip 420 is electrically connected with the second wire-bonding region 314 through the third metal conductive wire 530, so the second electrode contact 424 is electrically connected to another second metal pad 320 on the second surface 220, thereby connecting the first electrode contact 422 of the green chip 420 to the second electrode contact 424 thereof. Because the red chip 430 is a vertical LED chip, a second electrode contact thereof (not shown) opposite to the first electrode contact 432 is already electrically connected to another second metal pad 320 disposed on the second surface 220, so additional operations for connecting the second electrode contact and the second metal pad are unnecessary.

As can be readily appreciated by those of ordinary skill in the art, the LED device 100 of the present disclosure may also have other variations in addition to the aforesaid aspects.

For example, the first metal pad 310 having the blue chip 410 disposed thereon may be provided with the first wire-bonding region 312, and the second electrode contact 414 of the blue chip 410 is electrically connect with the first wire-bonding region 312 through the second metal conductive wire 520, while the way in which the second electrode contact 424 of the green chip 420 is electrically connected is not further defined. This will not prevent the first electrode contact 412 of the blue chip 410, the first electrode contact 432 of the red chip 430 and the first electrode contact 422 of the green chip 420 from having the same electrode contact polarity by being connected via a single first metal conductive wire 510.

Alternatively, the first metal pad 310 having the green chip 420 disposed thereon may also be provided with the second wire-bonding region 314, and the second electrode contact 424 of the green chip 420 is electrically connect with the second wire-bonding region 314 through the third metal conductive wire 530, while the way in which the second electrode contact 414 of the blue chip 410 is electrically connected is not further defined. This will also not prevent the first electrode contact 412 of the blue chip 410, the first electrode contact 432 of the red chip 430 and the first electrode contact 422 of the green chip 420 from having the same electrode contact polarity by being connected via a single first metal conductive wire 510.

Additionally, in addition to having a single first metal conductive wire 510 electrically connected to the first electrode contact 412 of the blue chip 410, the first electrode contact 432 of the red chip 430 and the first electrode contact 422 of the green chip 420 sequentially in the order of from the upper right corner to the lower right corner and then to the lower left corner as illustrated in the preferred embodiment of the present disclosure, the blue chip 410, the red chip 430 and the green chip 420 may also be sequentially disposed at four corners of the substrate 200 in the clockwise direction from the lower right corner to the lower left corner and then to the upper left corner. Alternatively, the blue chip 410, the red chip 430 and the green chip 420 may be sequentially disposed at four corners of the substrate 200 in the counterclockwise direction from the upper left corner to the lower left corner and then to the lower right corner. All these may be regarded as other implementations of the present disclosure.

Further speaking, the substrate 200 of the LED device 100 according to the embodiment of the present disclosure may have an area A, and the area A satisfies the following relational expression: A≤0.8 mm×0.8 mm. However, in an embodiment, the area A satisfies the following relational expression: 0.3 mm×0.3 mm≤A≤0.8 mm×0.8 mm. Moreover, in the aforesaid preferred embodiment, the area A satisfies the following relational expression: 0.3 mm×0.3 mm≤A≤0.6 mm×0.6 mm.

Figure 4:
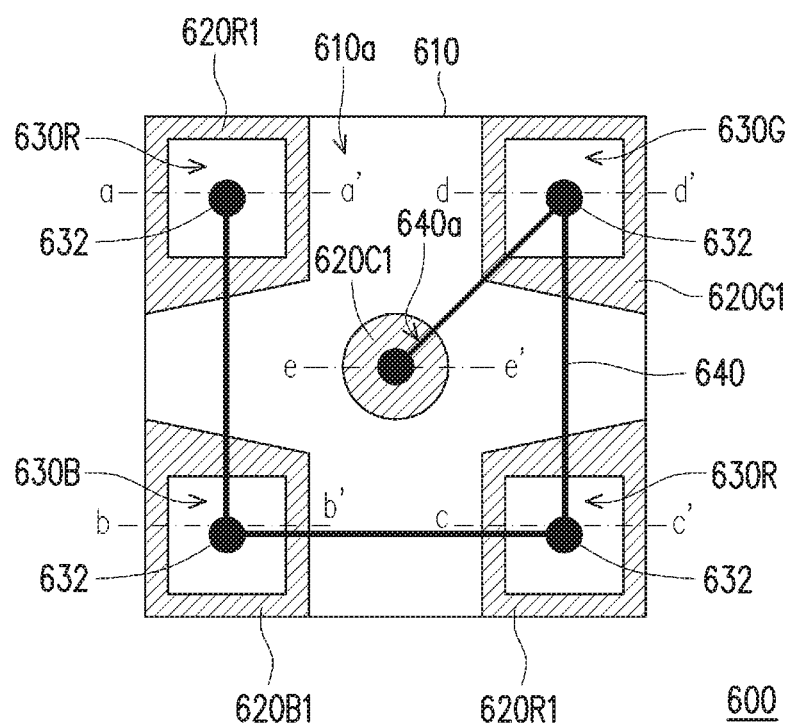
FIG. 4 is a schematic top view of an LED device according to another embodiment of the present disclosure.
Figure 5:
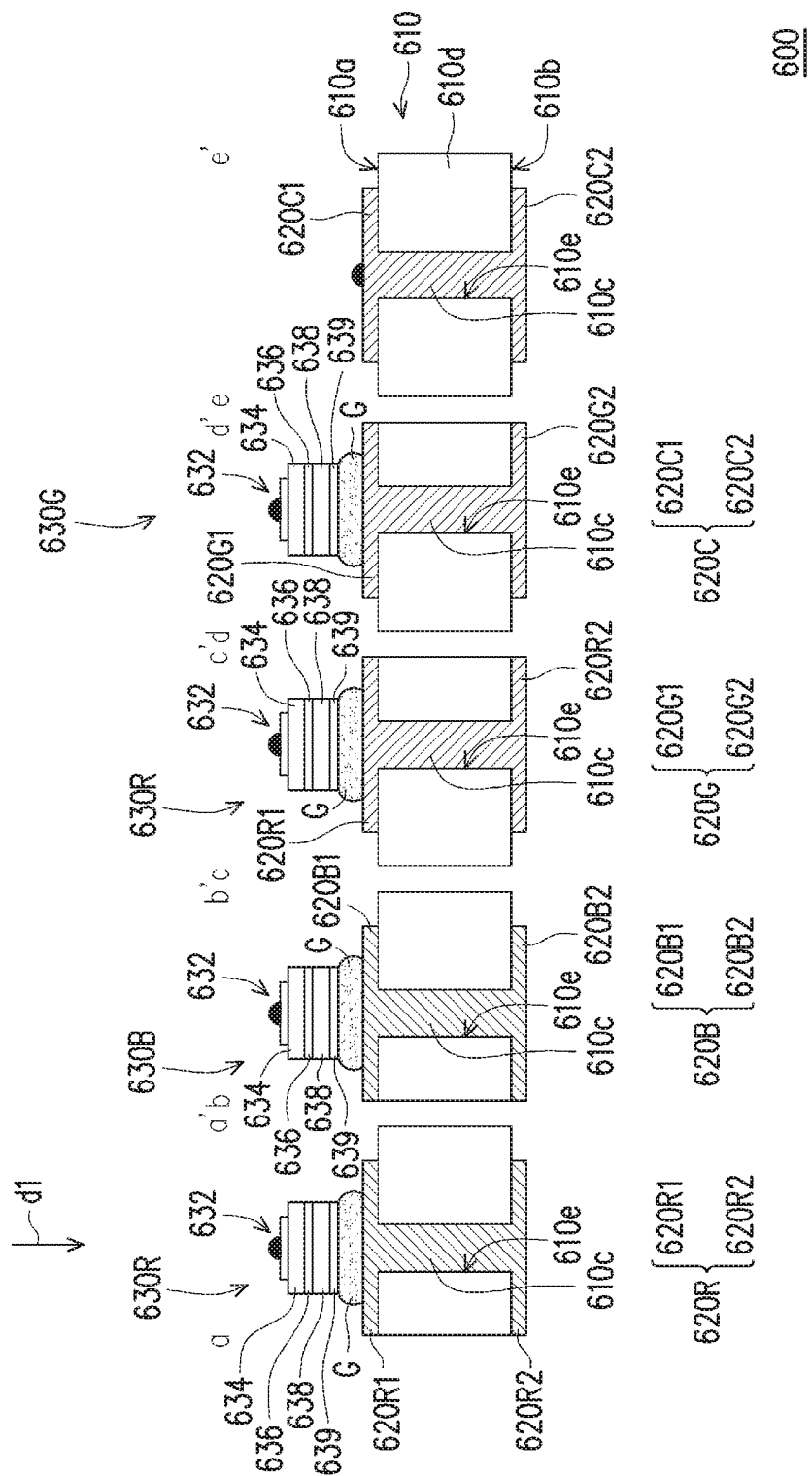
FIG. 5 is a schematic cross-sectional view of the LED device taken along section lines a-a', b-b', c-c', d-d', and e-e' of FIG. 4.

FIG. 4 is a schematic top view of an LED device according to another embodiment of the present disclosure. FIG. 5 is a schematic cross-sectional view of the LED device taken along section lines a-a', b-b', c-c', d-d', and e-e' of FIG. 4. Referring to FIG. 4 and FIG. 5 together, an LED device 600 comprises a substrate 610, a plurality of metal pads 620R, 620B, 620R, 620G, and 620C, a plurality of LED chips 630R, 630B, 630R, and 630G, and a first metal conductive wire 640 (shown in FIG. 4). The substrate 610 has a first surface 610a, a second surface 610b (shown in FIG. 5) disposed opposite to the first surface 610a and a plurality of vias 610c (shown in FIG. 5) disposed between the first surface 610a and the second surface 610b. In detail, as shown in FIG. 5, the substrate 610 of this embodiment comprises an insulated base 610d having a plurality of via holes 610e. Each of the via holes 610e runs through the first surface 610a and the second surface 610b. The via holes 610e of the insulated base 610d are filled with a conductive material so as to form the vias 610c.

As shown in FIG. 4, the metal pads 620R, 620B, 620R, 620G, and 620C are separated from each other. As shown in FIG. 5, the metal pads 620R, 620B, 620R, 620G, and 620C include a plurality of first metal pads 620R1, 620B1, 620R1, 620G1, and 620C1 disposed on the first surface 610a and a plurality of second metal pads 620R2, 620B2, 620R2, 620G2, and 620C2 disposed on the second surface 610b respectively. Each of the first metal pads 620R1, 620B1, 620R1, 620G1, and 620C1 of the metal pads 620R, 620B, 620R, 620G, and 620C is electrically connected with a corresponding one of the second metal pads 620R2, 620B2, 620R2, 620G2, and 620C2 via a corresponding one of the vias 610c. In this embodiment, the material of the metal pads 620R, 620B, 620R, 620G, and 620C is for example copper, but the present disclosure is not limited thereto. In other embodiments, the material of the metal pads 620R, 620B, 620R, 620G, and 620C may also be other suitable materials.

As shown in FIG. 4 and FIG. 5, each of the LED chips 630R, 630B, 630R, and 630G has at least one first electrode contact 632 and at least one second electrode contact 639 (shown in FIG. 5). The LED chips 630R, 630B, 630R, and 630G are disposed on the first metal pads 620R1, 620B1, 620R1, and 620G1 respectively. This embodiment differs from the embodiment of FIG. 2 and FIG. 3 in that: as shown in FIG. 5, each of the LED chips 630R, 630B, 630R, and 630G may optionally be a vertical chip. In detail, each of the LED chips 630R, 630B, 630R, and 630G has a first electrode contact 632, a first semiconductor layer 634, a light emitting layer 636, a second semiconductor layer 638, and one second electrode contact 639 electrically connected to a corresponding one of the first metal pads 620R1, 620B1, 620R1, and 620G1. The first electrode contact 632, the first semiconductor layer 634, the light emitting layer 636, the second semiconductor layer 638, the second electrode contact 639 and the corresponding one of the first metal pad 620R1, 620B1, 620R1, and 620G1 of one of the LED chips 630R, 630B, 630R, and 630G are arranged sequentially along a straight line d1. The direction of the straight line d1 is for example a direction opposite to the normal direction of the first surface 610a. The second electrode contact 639 of each of the LED chips 630R, 630B, 630R, and 630G may be fixed and electrically connected to a corresponding one of the first metal pads 620R1, 620B1, 620R1, and 620G1 via a conductive adhesive G (e.g., a silver adhesive). It shall be appreciated that, it is not limited in the present disclosure that all of the LED chips 630R, 630B, 630R, and 630G should be vertical chips, and the types of the LED chips adopted in the LED device depend on practical demands.

As shown in FIG. 4, the first metal conductive wire 640 is adapted to be electrically connected with the first electrode contact 632 of each of the LED chips 630R, 630B, 630R, and 630G. In other words, the main body of the first metal conductive wire 640 connects the first electrode contacts 632 of all the LED chips 630R, 630B, 630R, and 630G so that the first electrode contacts 632 of all the LED chips 630R, 630B, 630R, and 630G have the same electric potential. An end 640a of the first metal conductive wire 640 is electrically connected to the first metal pad 620C1 which has none of the LED chips disposed thereon.

As shown in FIG. 4 and FIG. 5, in this embodiment, the first metal pads 620R1, 620B1, 620R1, 620G1, and 620C1 are separated from each other, the second metal pads 620R2, 620B2, 620R2, 620G2, and 620C2 are separated from each other, the first metal pads 620R1, 620B1, 620R1, 620G1, and 620C1 are electrically connected with the second metal pads 620R2, 620B2, 620R2, 620G2, and 620C2 respectively. Drive signals can be transmitted from the outside to the second electrode contacts 639 of the LED chips 630R, 630B, 630R, and 630G through the second metal pads 620R2, 620B2, 620R2, and 620G2, and the same common signal can be transmitted to the first electrode contacts 632 of the LED chips 630R, 630B, 630R, and 630G through the second metal pad 620C2 so that the magnitudes of currents of the LED chips 630R, 630B, 630R, and 630G are capable of being independently controlled.

As shown in FIG. 4, in this embodiment, the first metal pads 620R1, 620B1, 620R1, 620G1, and 620C1 are five first metal pads, four first metal pads 620R1, 620B1, 620R1, and 620G1 are disposed at four corners of the substrate 610 respectively and the remaining one first metal pad 610C is not provided with any LED chip thereon. The LED chips 630R, 630B, 630R, and 630G include two first-color chips (e.g., two LED chips 630R), one second-color chip (e.g., the LED chip 630G) and one third-color chip (e.g., the LED chip 630B). The LED chips 630R, 630B, 630R, and 630G are disposed on the four first metal pads 620R1, 620B1, 620R1, and 620G1 respectively. A first imaginary straight line connects centers of the two LED chips 630R having the same color. A second imaginary straight line connects the center of the LED chip 630B and the center of the LED chip 630G having different colors. The first imaginary straight line is interlaced with the second imaginary straight line. Further speaking, the distances between the centers of any two adjacent LED chips 630R and 630B (630R and 630G) may be the same. In other words, an isosceles right triangle may be formed by connecting the centers of any three LED chips 630R, 630B and 630G (630R, 630R, and 630B; or 630R, 630R, and 630G), but the present disclosure is not limited thereto.

Further speaking, in this embodiment, the substrate 610 may be selected to be a rectangular substrate. Four first metal pads 620R1, 620R1, 620G1, and 620B1 may be disposed at four corners of the substrate 610 respectively, and the first metal pad 620C1 not provided with any LED chip thereon may be disposed in the middle of the four first metal pads 620R1, 620G1, 620R1 and 620B1. However, the present disclosure is not limited thereto. In other embodiments, the substrate 610 may also be designed in other shapes depending on the practical demands, and the first metal pads 620R1, 620B1, 620R1, 620G1, and 620C1 may be disposed on the substrate 610 in other appropriate manners.

In this embodiment, the two LED chips 630R are for example two red chips, the LED chip 630G is for example a green chip, and the LED chip 630B is for example a blue chip, but the present disclosure is not limited thereto. In other embodiments, the light emitting colors of the LED chips 630R, 630B, 630R, and 630G may also be combinations of other types of colors. It shall be noted that, in the embodiment of FIG. 4, the LED chips 630R, 630B, 630R, and 630G are all vertical LED chips. The size of the vertical LED chip is smaller than that of the horizontal LED chip, so the size of the LED device 600 of FIG. 4 can be further reduced as compared to the size of the LED device 100 of FIG. 2.

If a plurality of LED devices 600 are arranged on a drive circuit board (not shown) in an array, then the drive circuit board and the LED devices 600 can form a display (e.g., an information board). By electrically connecting the same first metal conductive wire 640 with the first electrode contacts 632 of the LED chips 630R, 630B, 630R, and 630G, each of the LED devices 600 may have the size thereof reduced, thereby improving the resolution of the display. Further speaking, when a plurality of LED devices 600 are arranged in an array, the distance between the centers of two LED chips of two adjacent LED devices 600 that are closest to each other is equal to the distance between the centers of two adjacent LED chips in a same LED device 600. For example, when a plurality of LED devices 600 are arranged in an array, a first LED device 600 is adjacent to a second LED device 600 with the first LED device 600 on the right and the second LED device 600 on the left. In this case, the distance between the center of the LED chip 630R at the upper left corner of the first LED device 600 and the center of the LED chip 630G at the upper right corner of the second LED device 600 may be equal to the distance between the center of the LED chip 630R at the upper left corner of the first LED device 600 and the center of the LED chip 630G at the upper right corner of the first LED device 600, but the present disclosure is not limited thereto.

Moreover, the aforesaid display comprising the drive circuit board and the plurality of LED devices 600 arranged in an array may optionally adopt the concept of "virtual pixel" so as to improve the resolution that a user actually feels. For example, when a plurality of LED devices 600 are arranged in an array, a first LED device 600 is adjacent to a second LED device 600 with the first LED device 600 on the right and the second LED device 600 on the left. In this case, the four LED chips 630R, 630B, 630R, and 630G of the first LED device 600 may form a physical pixel, and the LED chips 630R and 630B at the upper left corner and the lower left corner of the first LED device 600 together with the LED chips 630G and 630R at the upper right corner and the lower right corner of the second LED device 600 may form a virtual pixel under an appropriate drive mode, thereby improving the resolution that a user actually feels.

It shall be appreciated that, it is not limited in the present disclosure that the LED device 600 has to comprise four LED chips 630R, 630B, 630R, and 630G, and the number and the light emitting colors of the LED chips comprised in the LED device 600 may be dependent on the practical demands. For example, in other embodiments, one LED chip 630R may be omitted from the LED device 600, and the LED device is still within the scope claimed in the present disclosure. Furthermore, it is not limited in the present disclosure that the LED device 600 can only be applied to displays having the concept of "virtual pixel", and the LED device of the present disclosure can also be applied to general displays.

Figure 6:
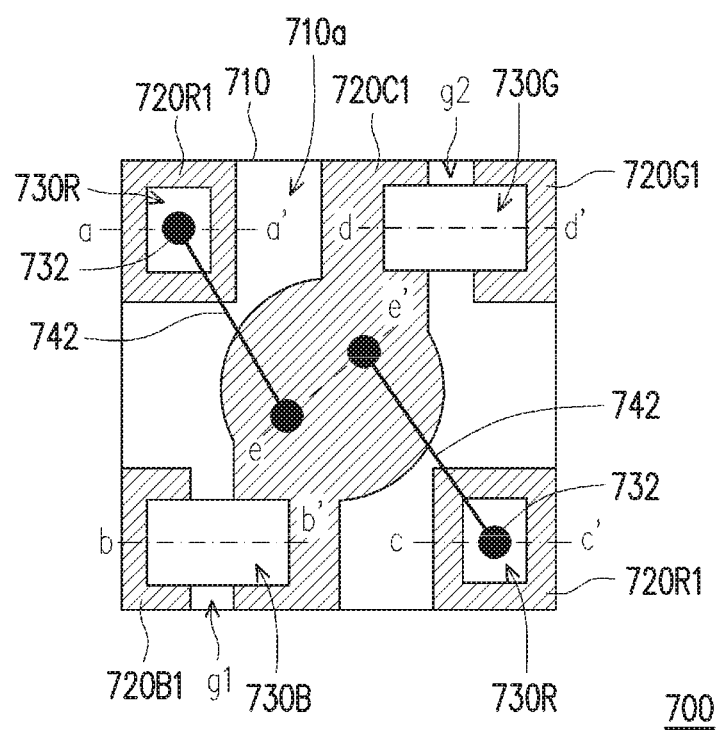
FIG. 6 is a schematic top view of an LED device according to another embodiment of the present disclosure.
Figure 7:
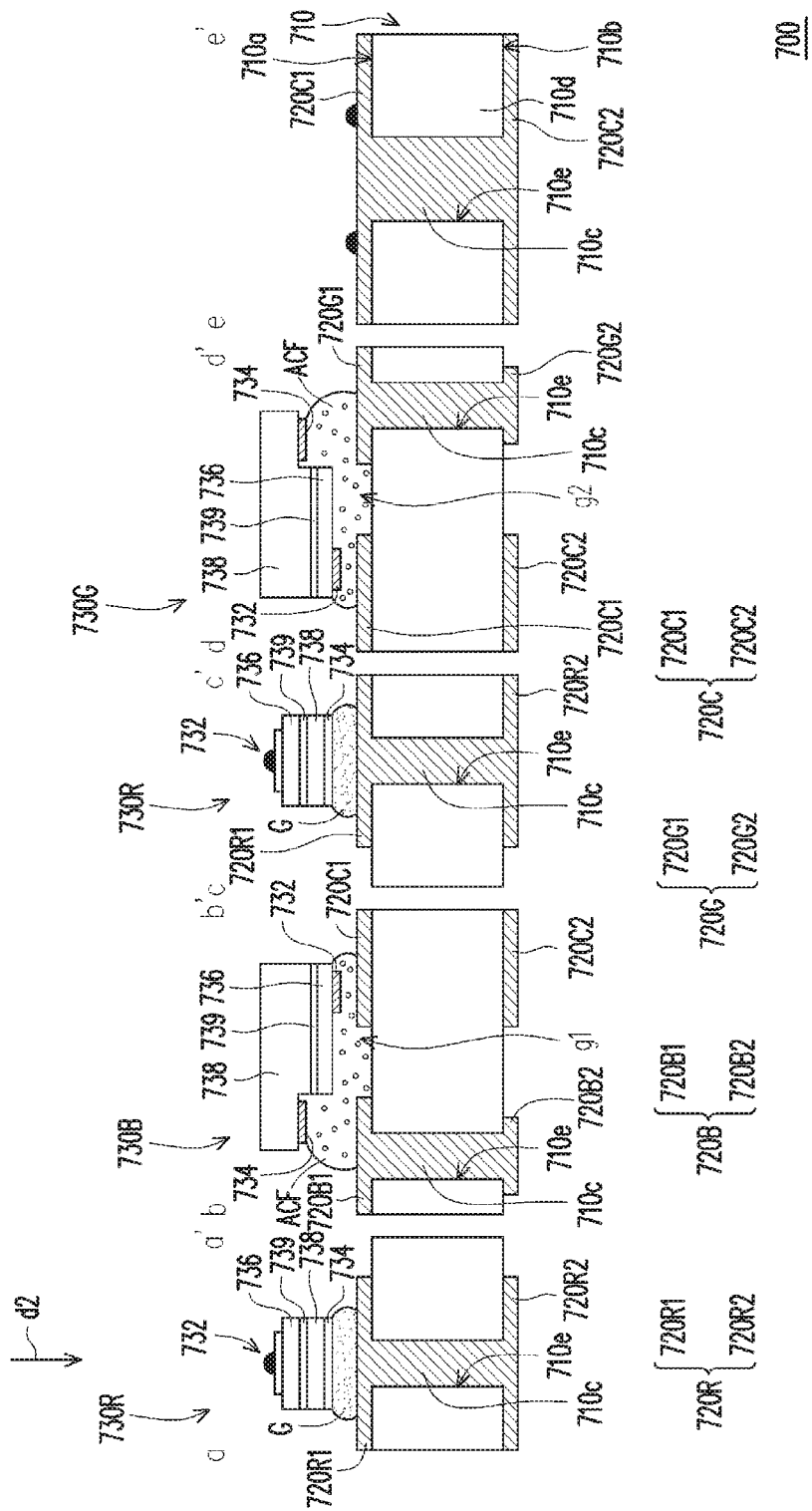
FIG. 7 is a schematic cross-sectional view of the LED device taken along section lines a-a', b-b', c-c', d-d', and e-e' of FIG. 6.

FIG. 6 is a schematic top view of an LED device according to another embodiment of the present disclosure. FIG. 7 is a schematic cross-sectional view of the LED device taken along section lines a-a', b-b', c-c', d-d', and e-e' of FIG. 6. Referring to FIG. 6 and FIG. 7 together, an LED device 700 comprises a substrate 710, a plurality of metal pads 720R, 720B, 720R, 720G and 720C, and a plurality of LED chips 730R, 730B, 730R, and 730G. The substrate 710 has a first surface 710a, a second surface 710b (shown in FIG. 7) disposed opposite to the first surface 710a and a plurality of vias 710c (shown in FIG. 7) disposed between the first surface 710a and the second surface 710b. In detail, as shown in FIG. 7, the substrate 710 comprises an insulated base 710d having a plurality of via holes 710e in this embodiment. Each of the via holes 710e runs through the first surface 710a and the second surface 710b. The via holes 710e of the insulated base 710d are filled with a conductive material so as to form the vias 710c.

As shown in FIG. 6 and FIG. 7, the metal pads 720R, 720B, 720R, 720G, and 720C are separated from each other. As shown in FIG. 7, the metal pads 720R, 720B, 720R, 720G, and 720C comprise a plurality of first metal pads 720R1, 720B1, 720R1, 720G1, and 720C1 disposed on the first surface 710a and a plurality of second metal pads 720R2, 720B2, 720R2, 720G2, and 720C2 disposed on the second surface 710b respectively. Each of the first metal pads 720R1, 720B1, 720R1, 720G1, and 720C1 of the metal pads 720R, 720B, 720R, 720G, and 720C is electrically connected with a corresponding one of the second metal pads 720R2, 720B2, 720R2, 720G2, and 720C2 via a corresponding one of the vias 710c. In this embodiment, the material of the metal pads 720R, 720B, 720R, 720G, and 720C is for example copper, but the present disclosure is not limited thereto. In other embodiments, the material of the metal pads 720R, 720B, 720R, 720G, and 720C may also be other suitable materials.

As shown in FIG. 6 and FIG. 7, each of the LED chips 730R, 730B, 730R, and 730G has at least one first electrode contact 732 and at least one second electrode contact 734 (shown in FIG. 7). The LED chips 730R, 730B, 730R, and 730G are disposed on part first metal pads 720R1, 720B1, 720R1, and 720G1 respectively. As shown in FIG. 7, the second electrode contacts 734 of the LED chips 730R, 730B, 730R, and 730G are electrically connected with the part first metal pads 720R1, 720B1, 720R1, and 720G1 respectively. On the other hand, as shown in FIG. 6 and FIG. 7, the first electrode contacts 732 of the LED chips 730R, 730B, 730R, and 730G are electrically connected to another first metal pad 720C1 other than the part first metal pads 720R1, 720B1, 720R1, and 720G1.

As shown in FIG. 6 and FIG. 7, at least one of the LED chips 730R, 730B, 730R, and 730G in the LED device 700 (e.g., the LED chips 730B, 730G) is a flip chip. Each flip chip (e.g., the LED chips 730B, 730G) comprises a first semiconductor layer 736, a second semiconductor layer 738, a light emitting layer 739 disposed between the first semiconductor layer 736 and the second semiconductor layer 738, a first electrode contact 732, and a second electrode contact 734, and the first electrode contact 732 and the second electrode contact 734 are disposed at the same side of the light emitting layer 739 and face the first surface 710a of the substrate 710. In this embodiment, two LED chips 730B and 730G may be flip chips, and the remaining LED chips 730R may be vertical chips. Each of the vertical LED chips 730R comprises the first electrode contact 732, the first semiconductor layer 736, the light emitting layer 739, the second semiconductor layer 738 and the second electrode contact 734 that are arranged sequentially along a straight line d2, and the direction of the straight line d2 is for example a direction opposite to the normal direction of the first surface 710a. It shall be appreciated that, it is not limited in the present disclosure that the LED device has to comprise two flip chips and two vertical chips. In other embodiments, one or more (other than two) LED chips may also be flip chips, and the remaining LED chips may optionally be flip chips or non-flip chips (e.g., horizontal chips, vertical chips, etc.) depending on the practical demands.

As shown in FIG. 7, in this embodiment, the first electrode contacts 732 of the flip-chip LED chips 730B and 730G may be electrically connected to the first metal pad 720C1 through the conductive adhesive ACF, and the second electrode contacts 734 of the flip-chip LED chips 730B and 730G may be electrically connected to the corresponding first metal pads 720B1 and 720G1 through the conductive adhesive ACF. In this embodiment, the conductive adhesive ACF may be an anisotropic conductive adhesive to avoid occurrence of short circuit between the first electrode contact 732 and the second electrode contact 734 of each of the flip-chip LED chips 730B and 730G. However, the present disclosure is not limited thereto. If the process capacity permits, then the first electrode contact 732 and the second electrode contact 734 of each flip-chip LED chip 730B (730G) may also be electrically connected with two corresponding first metal pads 720C1 and 720B1 (720C1 and 720G1) respectively via two common conductive adhesives (e.g., silver adhesives) that are separated from each other in other embodiments.

As shown in FIG. 7, in this embodiment, the second electrode contact 734 of each vertical LED chip 730R may be electrically connected to one corresponding first metal pads 720R1 through the conductive adhesive G. The conductive adhesive G may be a common conductive adhesive (e.g., a silver adhesive) or an anisotropic conductive adhesive, and no particular limitation is made to the type of the conductive adhesive G in the present disclosure. As shown in FIG. 6, the first electrode contact 732 of each vertical LED chip 730R may be electrically connected to the first metal pad 720C1 via a corresponding conductive wire 742.

As shown in FIG. 6 and FIG. 7, in this embodiment, the first metal pads 720R1, 720B1, 720R1, 720G1, and 720C1 are separated from each other, the second metal pads 720R2, 720B2, 720R2, 720G2, and 720C2 are separated from each other, the first metal pads 720R1, 720B1, 720R1, 720G1, and 720C1 are electrically connected with the second metal pads 720R2, 720B2, 720R2, 720G1, and 720C2 respectively. Drive signals can be transmitted from the outside to the second electrode contacts 734 of the LED chips 730R, 730B, 730R, and 730G through the second metal pads 720R2, 720B2, 720R2, and 720G2, and the same common signal can be transmitted to the first electrode contacts 732 of the LED chips 730R, 730B, 730R, and 730G through the second metal pad 720C2 so that the magnitudes of currents of the LED chips 730R, 730B, 730R, and 730G are capable of being independently controlled.

As shown in FIG. 6, in this embodiment, the first metal pads 720R1, 720B1, 720R1, 720G1, and 720C1 are five first metal pads, four first metal pads 720R1, 720B1, 720R1, and 720G1 are disposed at four corners of the substrate 710 respectively and the remaining one first metal pad 710C is not provided with any complete LED chip right thereabove. The LED chips 730R, 730B, 730R, and 730G include two first-color chips (e.g., two LED chips 730R), one second-color chip (e.g., the LED chip 730G) and one third-color chip (e.g., the LED chip 730B). The two LED chips 730R, the LED chip 730G and the LED chip 730B are disposed on the four first metal pads 720R1, 720R1, 720G1, and 720B1 respectively. A first imaginary straight line connects centers of the two LED chips 730R having the same color. A second imaginary straight line connects the center of the LED chip 730G and the center of the LED chip 730B having different colors. The first imaginary straight line is interlaced with the second imaginary straight line. Further speaking, the distances between the centers of any two adjacent LED chips 730R and 730B (730R and 730G) may be the same. In other words, an isosceles right triangle may be formed by connecting the centers of any three LED chips 730R, 730B and 730G (730R, 730R, and 730B; or 730R, 730R, and 730G), but the present disclosure is not limited thereto.

Further speaking, in this embodiment, the substrate 710 may be selected as a rectangular substrate. Four first metal pads 720R1, 720R1, 720G1, and 720B1 may be disposed at four corners of the substrate 710 respectively, and the first metal pad 720C1 may be disposed in the middle of the four first metal pads 720R1, 720B1, 720R1 and 720G1. However, the present disclosure is not limited thereto. In other embodiments, the substrate 710 may also be designed in other shapes depending on the practical demands, and the first metal pads 720R1, 720B1, 720R1, 720G1, and 720C1 may be disposed on the substrate 710 in other appropriate manners.

In this embodiment, the two LED chips 730R are for example two red chips, the LED chip 730G is for example a green chip, and the LED chip 730B is for example a blue chip, but the present disclosure is not limited thereto. In other embodiments, the light emitting colors of the LED chips 730R, 730B, 730R, and 730G may also be combinations of other types of colors. It shall be noted that, as shown in FIG. 6 and FIG. 7, at least one flip chip (e.g., the LED chips 730G, 730B) extends across gaps g1 and g2 between the first metal pads 720G1 and 720B1 on which the flip chips are disposed and the first metal pad 720C1 so that the first electrode contact 732 of the flip chip (e.g., the LED chips 730G and 730B) is electrically connected to the first metal pad 720C1. Thereby, at least one LED chip 730B (730G) does not need an additional conductive wire to be electrically connected to the corresponding first metal pads 720C1 and 720B1 (720C1 and 720G1) so that the LED device 700 can have a considerably small size.

Further speaking, if a plurality of LED devices 700 are arranged on a drive circuit board (not shown) in an array, then the drive circuit board and the LED devices 700 can form a display (e.g., an information board). By making at least one flip chip (e.g., the LED chips 730G, 730B) extend across gaps g1 and g2 between the first metal pads 720G1 and 720B1 on which the flip chips are disposed and another first metal pad 720C1, each of the LED devices 700 may have the size thereof reduced, thereby improving the resolution of the display. Further speaking, when a plurality of LED devices 700 are arranged in an array, the distance between the centers of two LED chips of two adjacent LED devices 700 that are closest to each other is equal to the distance between the centers of two adjacent LED chips in a same LED device 700. For example, when a plurality of LED devices 700 are arranged in an array, a first LED device 700 is adjacent to a second LED device 700 with the first LED device 700 on the right and the second LED device 700 on the left. In this case, the distance between the center of the LED chip 730R at the upper left corner of the first LED device 700 and the center of the LED chip 730G at the upper right corner of the second LED device 700 may be equal to the distance between the center of the LED chip 730R at the upper left corner of the first LED device 700 and the center of the LED chip 730G at the upper right corner of the first LED device 700, but the present disclosure is not limited thereto.

Moreover, the aforesaid display comprising the drive circuit board and the plurality of LED devices 700 arranged in an array may optionally adopt the concept of "virtual pixel" so as to improve the resolution that a user actually feels. For example, when a plurality of LED devices 700 are arranged in an array, a first LED device 700 is adjacent to a second LED device 700 with the first LED device 700 on the right and the second LED device 700 on the left. In this case, the four LED chips 730R, 730B, 730R, and 730G of the first LED device 700 may form a physical pixel, and the LED chips 730R and 730B at the upper left corner and the lower left corner of the first LED device 700 together with the LED chips 730G and 730R at the upper right corner and the lower right corner of the second LED device 700 may form a virtual pixel under an appropriate drive mode, thereby improving the resolution that a user actually feels.

It shall be additionally appreciated that, it is not limited in the present disclosure that the LED device 700 has to comprise four LED chips 730R, 730B, 730R, and 730G, and the number and the light emitting colors of the LED chips comprised in the LED device 700 may be dependent on the practical demands. For example, in other embodiments, one LED chip 730R may be omitted from the LED device 700, and the LED device is still within the scope claimed in the present disclosure. Furthermore, it is not limited in the present disclosure that the LED device 700 can only be applied to displays having the concept of "virtual pixel", and the LED device of the present disclosure can also be applied to general displays.

Figure 8:
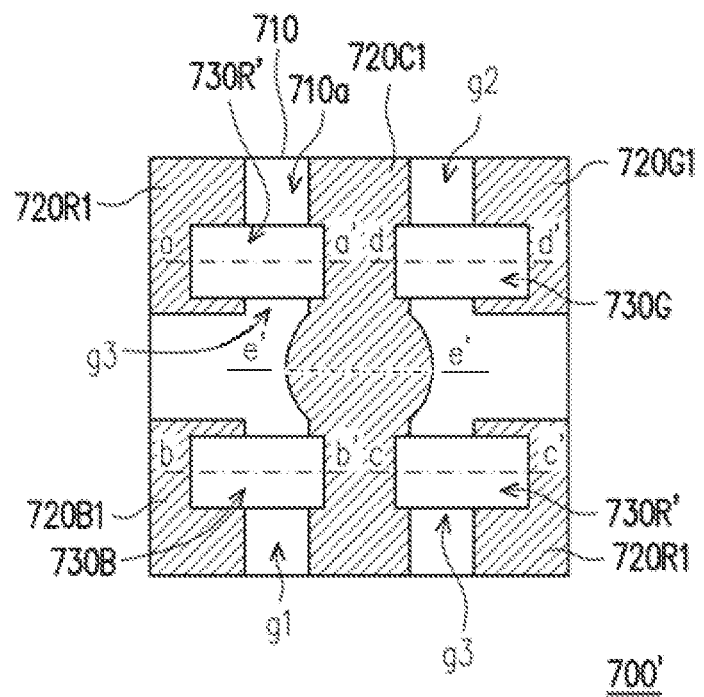
FIG. 8 is a schematic top view of an LED device according to yet another embodiment of the present disclosure.
Figure 9:
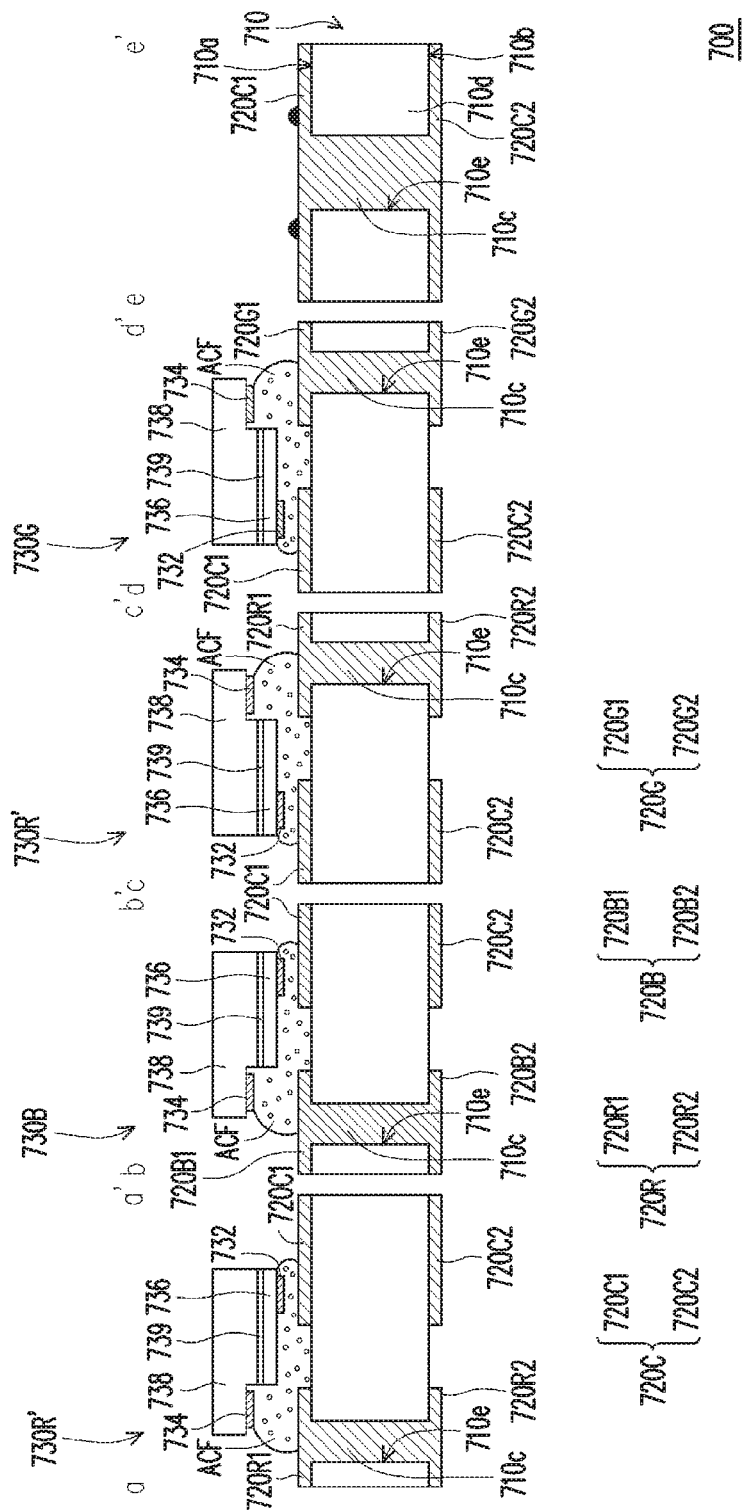
FIG. 9 is a schematic cross-sectional view of the LED device taken along section lines a-a', b-b', c-c', d-d', and e-e' of FIG. 8.

FIG. 8 is a schematic top view of an LED device according to yet another embodiment of the present disclosure. FIG. 9 is a schematic cross-sectional view of the LED device taken along section lines a-a', b-b', c-c', d-d', and e-e' of FIG. 8. An LED device 700' of FIG. 8 is similar to the LED device 700 of FIG. 6, so the same or corresponding elements are represented by the same or corresponding reference numbers. The LED device 700' of FIG. 8 mainly differs from the LED device 700 of FIG. 6 in that: the type of an LED chip 730R' of the LED device 700' is different from the type of the LED chip 730R of the LED device 700, and the LED device 700' may not be provided with the conductive wire 742 of the LED device 700. Thereinafter, only the aforesaid differences between the two devices will be described and the similarities therebetween will not be repeated.

Referring to FIG. 8 and FIG. 9 together, the LED device 700' comprises a substrate 710, a plurality of metal pads 720R, 720B, 720R, 720G and 720C, and a plurality of LED chips 730R', 730B, 730R', and 730G. The substrate 710 has a first surface 710a, a second surface 710b disposed opposite to the first surface 710a and a plurality of vias 710c disposed between the first surface 710a and the second surface 710b. The metal pads 720R, 720B, 720R, 720G, and 720C comprise a plurality of first metal pads 720R1, 720B1, 720R1, 720G1, and 720C1 disposed on the first surface 710a and a plurality of second metal pads 720R2, 720B2, 720R2, 720G2, and 720C2 disposed on the second surface 710b respectively. The first metal pads 720R1, 720B1, 720R1, 720G1, and 720C1 disposed on the first surface 710a are electrically connected with the second metal pads 720R2, 720B2, 720R2, 720G2, and 720C2 disposed on the second surface 710b through the vias 710c. Each of the LED chips 730R, 730B, 730R, and 730G has at least one first electrode contact 732 and at least one second electrode contact 734. The LED chips 730R, 730B, 730R, and 730G are disposed on part first metal pads 720R1, 720B1, 720R1, and 720G1 respectively. The second electrode contacts 734 of the LED chips 730R, 730B, 730R, and 730G are electrically connected with the part first metal pads 720R1, 720B1, 720R1, and 720G1 respectively. The first electrode contacts 732 of the LED chips 730R, 730B, 730R, and 730G are electrically connected to another first metal pad 720C1 other than the part first metal pads 720R1, 720B1, 720R1, and 720G1.

The embodiment of FIG. 8 and FIG. 9 differs from the embodiment of FIG. 6 and FIG. 7 in that: in addition to the LED chips 730G and 730B, the LED chips 730R' are also flip chips, and the conductive adhesive ACF for connecting the first electrode contact 732 and the second electrode contact 734 of the LED chip 730R' to the first metal pads 720R1 and 720C1 may be an anisotropic conductive adhesive. Briefly speaking, in the embodiment of FIG. 8 and FIG. 9, all of the LED chips 730R', 730B, 730R' and 730G may be flip chips. The LED chips 730R', 730B, 730R' and 730G extend across gaps g1, g2 and g3 between the first metal pads 720R1, 720B1, 720R1, and 720G1 on which the flip chips are disposed and another first metal pad 720C1 so that the first electrode contacts 732 of the LED chips 730R', 730B, 730R' and 730G are electrically connected to the first metal pad 720C1. The LED device 700' has effects and advantages similar to those of the LED device 700, and those effects and advantaged will not be described repeatedly herein. Similarly, the LED device from which one LED chip 730R' of the LED device 700' is omitted is also within the scope claimed in the present disclosure, and the LED device 700' can also be applied to displays having or not having the concept of "virtual pixel". These can be implemented by those of ordinary skill in the art according to the aforesaid descriptions, and thus will not be further described herein.

According to the above descriptions, the LED device of an embodiment of the present disclosure electrically connects the same first metal conductive wire with the first electrode contacts of the plurality of LEDs so as to reduce the size of the LED device.

Moreover, the LED device of another embodiment of the present disclosure comprises at least one flip-chip LED chip, the flip-chip LED chip extends across a gap between two adjacent first metal pads, and the first electrode contact and the second electrode contact of the flip-chip LED chip are electrically connected to the two adjacent first metal pads respectively. Thereby, at least one flip-chip LED chip does not need an additional conductive wire to be electrically connected to the corresponding first metal pad, which further reduces the size of the LED device.

The above disclosure is related to the detailed technical contents and inventive features thereof. People skilled in this field may proceed with a variety of modifications and replacements based on the disclosures and suggestions of the various embodiments as described without departing from the characteristics thereof. Nevertheless, although such modifications and replacements are not fully disclosed in the above descriptions, they have substantially been covered in the following claims as appended.

What is claimed is:

1. A light emitting diode (LED) device, comprising:
a substrate comprising a first surface, a second surface opposite to the first surface, and a plurality of vias disposed between the first surface and the second surface;
a plurality of metal pads comprising a plurality of first metal pads disposed on the first surface and a plurality of second metal pads disposed on the second surface respectively, the vias electrically connecting the first metal pads disposed on the first surface and the second metal pads disposed on the second surface; and
a plurality of LED chips each of which comprising at least one first electrode contact and at least one second electrode contact, wherein the LED chips are disposed on first ones of the first metal pads that are separate from each other, wherein the second electrode contacts of the LED chips are respectively electrically connected to the first ones of the first metal pads respectively, and wherein the first electrode contacts of the LED chips are electrically connected to a second one of the first metal pads other than the first ones of the first metal pads, wherein at least one of the LED chips is a flip chip,
wherein the substrate comprises a quadrilateral substrate, wherein the first ones of the first metal pads include four metal pads arranged at four corners of the quadrilateral substrate respectively, and
wherein the LED chips include two first-color chips, one second-color chip and one third-color chip.

2. The LED device of claim 1, wherein a first imaginary straight line connects the two first-color chips having the same color, wherein a second imaginary straight line connects the second-color chip and the third-color chip having different colors, and wherein the first imaginary straight line is interlaced with the second imaginary straight line.

3. The LED device of claim 1, wherein the second one of the first metal pads is disposed in the middle of the four first ones of the first metal pads.

4. The LED device of claim 1, wherein the two first-color chips comprise red chips, wherein the second-color chip comprises a green chip, and wherein the third-color chip comprises a blue chip.

5. The LED device of claim 4, wherein the red chips comprise vertical chips, and wherein the green chip and the blue chip comprise flip chips.

6. The LED device of claim 1, wherein the first-color chips, the second-color chip and the third-color chip are flip chips.

7. The LED device of claim 1, further comprising an anisotropic conductive adhesive, wherein a first electrode contact of the flip chip is electrically connected to the second one of the first metal pads through the anisotropic conductive adhesive, and wherein a second electrode contact of the flip chip is electrically connected to a corresponding one of the first metal pads through the anisotropic conductive adhesive.

8. The LED device of claim 1, wherein the flip chip extends across a gap between the first metal pad on which the flip chip is disposed and the second one of the first metal pads so that the first electrode contact of the flip chip is electrically connected to the second one of the first metal pads.

9. The LED device of claim 1, wherein the quadrilateral substrate is a rectangular substrate.

10. A light emitting diode (LED) device, comprising:
a substrate comprising a first surface, a second surface opposite to the first surface, and a plurality of vias disposed between the first surface and the second surface;
a plurality of metal pads comprising a plurality of first metal pads disposed on the first surface and a plurality of second metal pads disposed on the second surface respectively, the vias electrically connecting the first metal pads disposed on the first surface and the second metal pads disposed on the second surface; and
a plurality of LED chips each of which comprising at least one first electrode contact and at least one second electrode contact, wherein the LED chips are disposed on first ones of the first metal pads that are separate from each other, wherein the second electrode contacts of the LED chips are respectively electrically connected to the first ones of the first metal pads respectively, and wherein the first electrode contacts of the LED chips are electrically connected to a second one of the first metal pads other than the first ones of the first metal pads, wherein at least one of the LED chips is a flip chip,
wherein the LED chips are electrically connected to outside through the second metal pads disposed on the second surface of the substrate, and wherein currents flowing through the LED chips are independently controlled.

11. The LED device of claim 10, wherein the first metal pads comprise five first metal pads, wherein four of the five first metal pads are the first ones of the first metal pads and are arranged at four corners of the substrate respectively, wherein the remaining one of the five metal pads is the second one of the first metal pads, wherein the LED chips comprise two first-color chips, one second-color chip and one third-color chip, wherein the two first-color chips, the second-color chip and the third-color chip are disposed on the four first metal pads respectively, wherein a first imaginary straight line connects the two first-color chips having the same color, wherein a second imaginary straight line connects the second-color chip and the third-color chip having different colors, and wherein the first imaginary straight line is interlaced with the second imaginary straight line.

12. The LED device of claim 11, wherein the substrate comprises a quadrilateral substrate, wherein the four first metal pads are disposed at four corners of the quadrilateral substrate respectively, and wherein the second one of the first metal pads is disposed in the middle of the four first ones of the first metal pads.

13. The LED device of claim 12, wherein the quadrilateral substrate is a rectangular substrate.

14. The LED device of claim 11, wherein the two first-color chips comprise red chips, wherein the second-color chip comprises a green chip, and wherein the third-color chip comprises a blue chip.

15. The LED device of claim 14, wherein the red chips comprise vertical chips, and wherein the green chip and the blue chip comprise flip chips.

16. The LED device of claim 11, wherein the first-color chips, the second-color chip and the third-color chip are flip chips.

17. The LED device of claim 10, further comprising an anisotropic conductive adhesive, wherein a first electrode contact of the flip chip is electrically connected to the second one of the first metal pads through the anisotropic conductive adhesive, and wherein a second electrode contact of the flip chip is electrically connected to a corresponding one of the first metal pads through the anisotropic conductive adhesive.

18. The LED device of claim 10, wherein the flip chip extends across a gap between the first metal pad on which the flip chip is disposed and the second one of the first metal pads so that the first electrode contact of the flip chip is electrically connected to the second one of the first metal pads.

* * * * *